(12) United States Patent
Huang et al.

(10) Patent No.: US 12,237,382 B2
(45) Date of Patent: Feb. 25, 2025

(54) SEMICONDUCTOR DEVICE AND POWER AMPLIFIER

(71) Applicant: WIN SEMICONDUCTORS CORP., Taoyuan (TW)

(72) Inventors: Chieh-Chih Huang, Taoyuan (TW); Yan-Cheng Lin, Taoyuan (TW); Cheng-Kuo Lin, Taoyuan (TW); Wei-Chou Wang, Taoyuan (TW); Che-Kai Lin, Taoyuan (TW); Jiun-De Wu, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 426 days.

(21) Appl. No.: 17/827,955

(22) Filed: May 30, 2022

(65) Prior Publication Data

US 2022/0406905 A1 Dec. 22, 2022

Related U.S. Application Data

(60) Provisional application No. 63/212,169, filed on Jun. 18, 2021.

(51) Int. Cl.
*H01L 29/417* (2006.01)
*H01L 29/778* (2006.01)
(Continued)

(52) U.S. Cl.
CPC ...... *H01L 29/4175* (2013.01); *H01L 29/7786* (2013.01); *H01L 29/2003* (2013.01);
(Continued)

(58) Field of Classification Search
CPC ............... H01L 29/7786; H01L 29/778; H01L 29/7782; H01L 29/7783; H01L 29/66462;
(Continued)

(56) References Cited

U.S. PATENT DOCUMENTS 7,838,904 B2 11/2010 Nakazawa
10,541,324 B2 1/2020 Green
(Continued)

FOREIGN PATENT DOCUMENTS

| CN | 104393039 A | 3/2015 |
| CN | 105931964 A | 9/2016 |
| CN | 112736131 A | 4/2021 |

OTHER PUBLICATIONS

Chinese language office action dated Apr. 29, 2024, issued in application No. TW 112119847.
(Continued)

*Primary Examiner* — Wasiul Haider
(74) *Attorney, Agent, or Firm* — McClure, Qualey & Rodack, LLP

(57) ABSTRACT

A semiconductor device includes: a substrate; a channel layer disposed on the substrate, wherein the channel layer is made of GaN; a barrier layer disposed on the channel layer, wherein the barrier layer is made of $Al_zGa_{1-z}N$; and an inserting structure inserted between the channel layer and the barrier layer. The inserting structure includes: a first inserting layer disposed on the channel layer, wherein the first inserting layer is made of $Al_xGa_{1-x}N$; and a second inserting layer disposed on the first inserting layer, wherein the second inserting layer is made of $Al_yGa_{1-y}N$, and y is greater than x. The semiconductor device further includes: a gate electrode disposed on the barrier layer; a source electrode and a drain electrode disposed on the barrier layer and respectively at opposite sides of the gate electrode; and a spike region formed below at least one of the source electrode and the drain electrode.

20 Claims, 5 Drawing Sheets

(51) Int. Cl.
    *H01L 29/20*          (2006.01)
    *H01L 29/205*         (2006.01)
    *H01L 29/45*          (2006.01)
    *H03F 3/213*          (2006.01)

(52) U.S. Cl.
    CPC .......... *H01L 29/205* (2013.01); *H01L 29/452* (2013.01); *H03F 3/213* (2013.01)

(58) Field of Classification Search
    CPC ..... H01L 29/452; H01L 29/45; H01L 29/417; H01L 29/4175; H01L 29/1033
    See application file for complete search history.

(56)             References Cited

U.S. PATENT DOCUMENTS

| | | | |
|---|---|---|---|
| 2005/0274980 A1 | 12/2005 | Miyoshi | |
| 2016/0043187 A1* | 2/2016 | Saito | H01L 29/7786 257/76 |
| 2018/0138306 A1 | 5/2018 | Jeon et al. | |
| 2022/0320326 A1* | 10/2022 | Cheng | H01L 29/7786 |

OTHER PUBLICATIONS

Douglas, E.A., et al.; "Ohmic contacts to Alrich AlGaN heterostructures;" Jun. 2017; pp. 1-9.

Chinese language Notice of Allowance dated Mar. 3, 2023, issued in application No. TW 111122368.

* cited by examiner

SEMICONDUCTOR DEVICE AND POWER AMPLIFIER

CROSS REFERENCE TO RELATED APPLICATIONS

This application claims priority of provisional application of U.S. Patent Application No. 63/212,169 filed on Jun. 18, 2021, the entirety of which is incorporated by reference herein.

BACKGROUND

Technical Field

The present disclosure relates to a semiconductor device and a power amplifier, and in particular it relates to an inserting structure.

Description of the Related Art

Gallium nitride (GaN)-based semiconductor materials have numerous extraordinary characteristics, such as high heat resistance, wide band-gap, and high electron saturation speed. Therefore, GaN-based semiconductor materials may be appropriately applied under high-temperature, high-voltage, or high-current environments. In recent years, GaN-based semiconductor materials have been widely used in light emitting diode devices or high-frequency devices, such as high electron mobility transistor (HEMT) of heterojunction.

In order to reduce contact resistance, the source electrode and the drain electrode of the high electron mobility transistor may often be subjected to an anneal process. Through such thermal treatment, the alloyed metal material may generate spike structures that extend downward into the underlying semiconductor materials. The region of spike structures (or the spike region) can lower the contact resistance. However, the spike region may also induce current leakage, which leads to breakdown degradation.

SUMMARY

In an embodiment, a semiconductor device includes: a substrate; a channel layer disposed on the substrate, wherein the channel layer is made of gallium nitride (GaN); a barrier layer disposed on the channel layer, wherein the barrier layer is made of $Al_zGa_{1-z}N$; and an inserting structure inserted between the channel layer and the barrier layer. The inserting structure includes: a first inserting layer disposed on the channel layer, wherein the first inserting layer is made of $Al_xGa_{1-x}N$; and a second inserting layer disposed on the first inserting layer, wherein the second inserting layer is made of $Al_yGa_{1-y}N$, and y is greater than x. The semiconductor device further includes: a gate electrode disposed on the barrier layer; a source electrode disposed on the barrier layer at a first side of the gate electrode; and a drain electrode disposed on the barrier layer at a second side of the gate electrode opposite to the first side of the gate electrode. A spike region is formed below at least one of the source electrode and the drain electrode.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
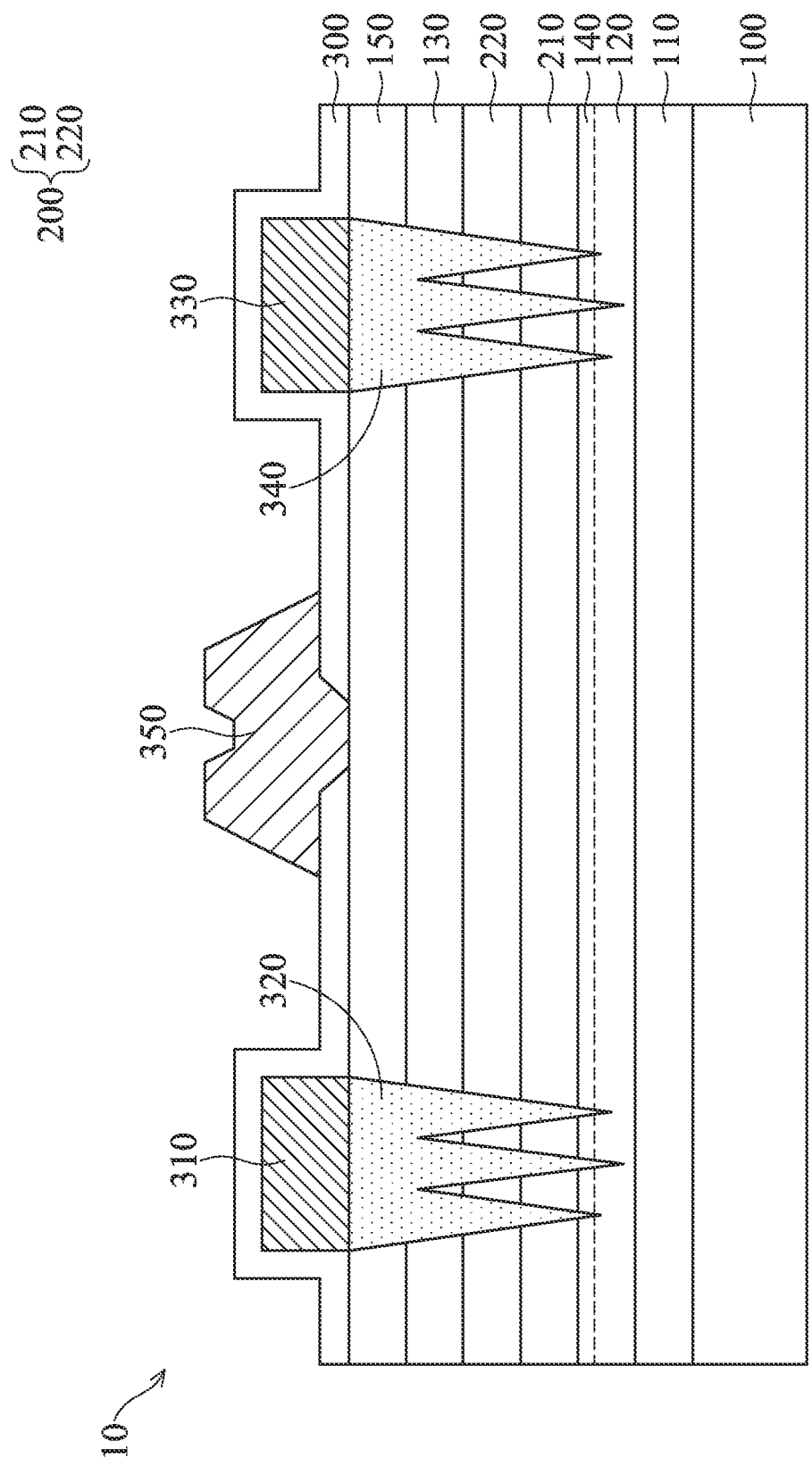
FIG. 1 is a cross-sectional view of one design of a semiconductor device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value, and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity, and does not in itself dictate a relationship between the various embodiments and/or configurations discussed.

In a high-power semiconductor device or a power amplifier having the semiconductor device, such as a high electron mobility transistor (HEMT), an ohmic contact may be formed between the source/drain electrode and the epitaxial structure underneath. The source electrode and the drain electrode are often made of conductive materials (such as metals), while the epitaxial structure may be made of semiconductor materials. The ohmic contact may be referred to as an interface between the metal materials and the semiconductor materials. Through a thermal treatment (for example, an annealing process), one or more metal layers within the source electrode and the drain electrode may be alloyed and extended into the epitaxial structure below. As the extension continues further into the epitaxial structure, the alloyed metal materials may gradually form into one or more spike structures, which may be known as a spike region. The spike region may extend from at least one of the source electrode and the drain electrode. Therefore, a larger contact area between the metal materials and the semiconductor materials may be obtained. The larger contact area allows for a lower contact resistance (Re) of the semiconductor device, which in turn exhibits a more superior performance during operation.

Nevertheless, the larger contact area between the metal materials and the semiconductor materials may also imply a higher probability of current leakage. With a significant amount of current leakage, the operation performance of the semiconductor device may be undermined. In particular, the device breakdown performance may be compromised. For this reason, an inserting structure may be introduced to the semiconductor device of the present application. The inserting structure may be inserted into the epitaxial structure, which can compensate for breakdown loss resulting from the spike structures. As a result, the semiconductor device of the present application is able to demonstrate a sufficiently high breakdown voltage and a relatively low contact resistance simultaneously.

FIG. 1 is a cross-sectional view of one design of a semiconductor device 10, according to some embodiments of the present disclosure. According to some embodiments of the present disclosure, the semiconductor device 10 may include a high electron mobility transistor (for example, a GaN-based high electron mobility transistor).

Referring to FIG. 1, the semiconductor device 10 may include a substrate 100, a buffer layer 110, a channel layer 120, a barrier layer 130, a two-dimensional electron gas (2DEG) 140, a cap layer 150, an inserting structure 200, a passivation layer 300, a source electrode 310, a first spike region 320, a drain electrode 330, a second spike region 340, and a gate electrode 350. The inserting structure 200 may include a first inserting layer 210 and a second inserting layer 220. The buffer layer 110, the channel layer 120, the barrier layer 130, and the cap layer 150 may be formed on the substrate 100 by an epitaxial process and thus may be known as an epitaxial structure. As previously mentioned, the inserting structure 200 may be inserted within the epitaxial structure, for example, between the channel layer 120 and the barrier layer 130.

In some embodiments, the substrate 100 may also be, for example, a wafer or a chip, but the present disclosure is not limited thereto. In some embodiments, the substrate 100 may be a semiconductor substrate, for example, silicon (Si) substrate. Furthermore, in some embodiments, the semiconductor substrate may also be an elemental semiconductor including germanium (Ge), a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

In some embodiments, the substrate 100 may be an n-type or a p-type conductive type. In some embodiments, the substrate 100 may be a silicon carbide substrate doped with vanadium (V).

In some embodiments, the substrate 100 may include isolation structures (not shown) to define active regions and to electrically isolate active region elements within or above the substrate 100.

Referring to FIG. 1, the buffer layer 110, the channel layer 120, the barrier layer 130, and the cap layer 150 may be sequentially formed on the substrate 100. Conventionally, the two-dimensional electron gas 140 may be formed in the channel layer 120 near an interface between the channel layer 120 and the barrier layer 130. However, since the inserting structure 200 are inserted between the channel layer 120 and the barrier layer 130, the two-dimensional electron gas 140 may be located near the interface between the channel layer 120 and the inserting structure 200.

According to some embodiments, the buffer layer 110 may alleviate the strain of the overlying channel layer 120 to be formed subsequently to prevent the generation of defects within the channel layer 120. The strain may be caused by a mismatch between the channel layer 120 and the underlying film. In some embodiments, a nucleation layer may be additionally disposed between the substrate 100 and the buffer layer 110 to further alleviate the lattice difference between the substrate 100 and the overlying film, thereby elevating the crystalline quality. In a specific embodiment of the present disclosure, the buffer layer 110 may be made of $Al_wGa_{1-w}N$, and w satisfies the condition $0 \leq w \leq 0.2$, for example, w may be between 0 and 0.1. It should be noted that, when w equals 0, the buffer layer 110 may be made of pure or substantially pure GaN. The thickness of the buffer layer 110 may be approximately between 200 Å and 1800 Å.

According to some embodiments, the channel layer 120 may provide an electron transmission path between the source electrode 310 and the drain electrode 330 (described in detail below) of the transistor structure (such as the high electron mobility transistor). In some embodiments, the channel layer 120 may be doped (for example, with n-type dopants or p-type dopants) or undoped. In a specific embodiment of the present disclosure, the channel layer 120 may be made of pure or substantially pure GaN. The thickness of the channel layer 120 may be approximately between 50 Å and 200 Å.

According to some embodiments, the barrier layer 130 may be made of $Al_zGa_{1-z}N$, and z satisfies the condition $0.18 \leq z \leq 0.50$, for example, z may be between 0.2 and 0.3, or between 0.3 and 0.5. The thickness of the barrier layer 130 may be approximately between 80 Å and 260 Å.

According to some embodiments, the ohmic contacts of the source electrode 310 and the drain electrode 330, and the Schottky contact of the gate electrode 350 are both located on the cap layer 150. In a specific embodiment of the present disclosure, the cap layer 150 may be made of pure or substantially pure GaN. The thickness of the cap layer 150 may be approximately between 10 Å and 30 Å.

Still referring to FIG. 1, the inserting structure 200 is inserted between the channel layer 120 and the barrier layer 130. The first inserting layer 210 of the inserting structure 200 is disposed on the channel layer 120. According to some embodiments of the present disclosure, the two-dimensional electron gas 140 may be generated in the channel layer 120 near an interface between the channel layer 120 and the first inserting layer 210. In a specific embodiment of the present disclosure, the first inserting layer 210 may be made of $Al_xGa_{1-x}N$, and x satisfies the condition $0.15 \leq x \leq 0.50$, for example, x may be between 0.15 and 0.18, or between 0.2 and 0.5. In some embodiments, the aluminum composition (such as x of $Al_xGa_{1-x}N$) is substantially uniform across the entire thickness of the first inserting layer 210. The thickness of the first inserting layer 210 may be approximately between 5 Å and 20 Å.

As shown in FIG. 1, the second inserting layer 220 of the inserting structure 200 is disposed between the first inserting layer 210 and the barrier layer 130. According to some embodiments of the present disclosure, the aluminum composition of the second inserting layer 220 is adjusted to be higher than the aluminum composition of the first inserting layer 210.

In some embodiments, the combination of the first inserting layer 210 and the second inserting layer 220 improves the breakdown voltage of the semiconductor device 10.

In a specific embodiment of the present disclosure, the second inserting layer 220 may be made of $Al_yGa_{1-y}N$, and y satisfies the condition $0.5 < y \leq 1$. It should be noted that, when y equals 1, the second inserting layer 220 may be made of pure or substantially pure aluminum nitride (AlN). The thickness of the second inserting layer 220 may be approximately between 5 Å and 15 Å.

In some embodiments, the second inserting layer 220 is made of AlN, and the first inserting layer 210 is made of $Al_xGa_{1-x}N$ ($0.2 \leq x \leq 0.3$). By adjusting the aluminum composition of the first inserting layer 210 and the aluminum composition of the second inserting layer 220, the semiconductor device 10 may have a higher transconductance peak value compared to the semiconductor device with only the second inserting layer 220 and without the first inserting layer 210.

In some embodiments, the ratio of the thickness of the second inserting layer 220 to the thickness of the first inserting layer 210 may be between 0.25 and 3. The thickness of the second inserting layer 220 and the thickness of the first inserting layer 210 may be adjusted to improve the cut-off frequency of the semiconductor device 10.

Still referring to FIG. 1, the ratio of the aluminum composition (such as x of $Al_xGa_{1-x}N$) of the first inserting layer 210 to the aluminum composition (such as z of $Al_zGa_{1-z}N$) of the barrier layer 130 may be between 0.5 and 1.5, for example, between 0.8 and 1.2, or for example, 1. In some embodiments, by adjusting the aluminum compositions of the first inserting layer 210 and the barrier layer 130, the Shottky turn-on voltage and the saturation output power of the semiconductor device 10 may both be improved. Moreover, when the ratio equals 1, or when the aluminum compositions of the first inserting layer 210 and the barrier layer 130 are identical, the same material may be used to epitaxially grow the barrier layer 130 and the first inserting layer 210, in which the manufacture of the semiconductor device 10 may be more simplified with lower cost.

Referring to FIG. 1, the source electrode 310 and the drain electrode 330 may be formed on the cap layer 150. According to some embodiments of the present disclosure, the source electrode 310 and the drain electrode 330 are positioned respectively on opposing sides of the subsequently formed gate electrode 350. The source electrodes 310 and the drain electrode 330 may function respectively as a source terminal and a drain terminal of the transistor structure (such as the high electron mobility transistor) of the semiconductor device 10. In a specific embodiment of the present disclosure, the source electrode 310 and the drain electrode 330 are made of titanium (Ti), nickel (Ni), aluminum (Al), gold (Au), molybdenum (Mo), platinum (Pt), or a combination thereof.

Still referring to FIG. 1, the first spike region 320 and the second spike region 340 may be formed under the source electrode 310 and the drain electrode 330, respectively. As shown in FIG. 1, the first spike region 320 and the second spike region 340 may extend downward into the underlying semiconductor films (such as the buffer layer 110, the channel layer 120, the barrier layer 130, the cap layer 150, and the inserting structure 200). The ohmic contacts may be defined by the interface between the source electrode 310 and the cap layer 150, and the interface between the drain electrode 330 and the cap layer 150. The first spike region 320 and the second spike region 340 may reduce the contact resistance of the transistor structure (such as the high electron mobility transistor) of the semiconductor device 10. Materials of the first spike region 320 and the second spike region 340 may be similar to those of the source electrode 310 and the drain electrode 330. In a specific embodiment of the present disclosure, the first spike region 320 and the second spike region 340 may be made of titanium, titanium nitride (TiN), or a combination thereof.

After the source electrode 310 and the drain electrode 330 are formed, a thermal treatment may be performed. The thermal treatment may be carried out in-situ or ex-situ, and may be any types of annealing process, such as rapid thermal anneal (RTA), spike anneal, soak anneal, laser anneal, furnace anneal, or the like. The processing temperature of the thermal treatment may be approximately between 800° C. and 1000° C. The processing temperature may need to be high enough for the metal materials (of the source electrode 310 and the drain electrode 330) to react with the underlying semiconductor materials to form the first spike region 320 and the second spike region 340. Except for the processing temperature, the extension of the first spike region 320 and the second spike region 340 may also be determined by the process duration. Moreover, the thermal treatment may be performed in the environment of selected process gas, and the illustrative process gas may include, but are not limited to, nitrogen ($N_2$), ammonia ($NH_3$), oxygen ($O_2$), dinitrogen monoxide ($N_2O$), argon (Ar), helium (He), hydrogen ($H_2$), or the like. As shown in FIG. 1, the first spike region 320 and the second spike region 340 may be designed to reach into the channel layer 120.

Still referring to FIG. 1, a passivation layer 300 may be conformally formed on the surface of the cap layer 150, the source electrode 310, and the drain electrode 330. The passivation layer 300 may provide protection and insulation of the underlying epitaxial structure, the source electrode 310, and the drain electrode 330 from the subsequently formed elements and the fabrication processes thereof. Even though the passivation layer 300 of the present application is illustrated to be a single layer, but the present disclosure is not limited thereto. For example, the passivation layer 300 may include any number of dielectric layers, depending on application and design requirements.

In a specific embodiment of the present disclosure, the passivation layer 300 may be made of silicon nitride, aluminum nitride, silicon oxide, aluminum oxide, or a combination thereof. The passivation layer 300 may be formed by chemical vapor deposition (CVD), high-density plasma chemical vapor deposition (HDP-CVD), plasma-enhanced chemical vapor deposition (PECVD), flowable chemical vapor deposition (FCVD), sub-atmospheric chemical vapor deposition (SACVD), atomic layer deposition (ALD), the like, or a combination thereof.

Referring to FIG. 1, the gate electrode 350 may be formed on the passivation layer 300. In some embodiments, the gate electrode 350 is located laterally between the source electrode 310 and the drain electrode 330. The gate electrode 350 may function as a gate terminal of the transistor structure (such as the high electron mobility transistor) of the semiconductor device 10. As shown in FIG. 1, a portion of the gate electrode 350 penetrates through the passivation layer 300 and sits on the cap layer 150. The contact area of the portion of the gate electrode 350 and the cap layer 150 may be defined as the Schottky contact. In a specific embodiment of the present disclosure, the gate electrode 350 may be made of nickel, palladium (Pd), platinum, chromium (Cr), gold, titanium, or a combination thereof.

Figure 2:
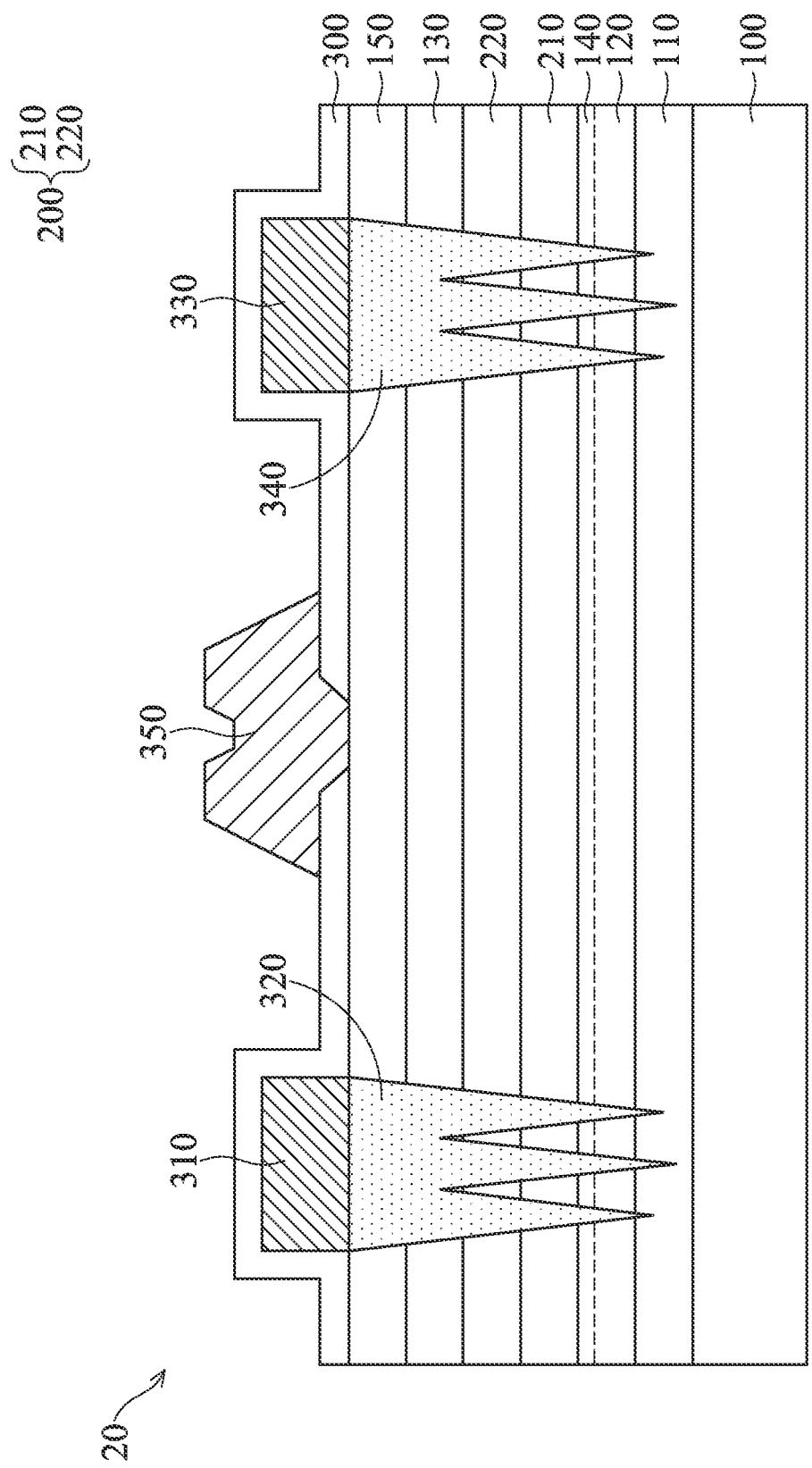
FIG. 2 is a cross-sectional view of another design of a semiconductor device, according to some embodiments of the present disclosure.

FIG. 2 is a cross-sectional view of another design of a semiconductor device 20, according to some embodiments of the present disclosure. In comparison with FIG. 1, FIG. 2 illustrates a deeper extension of the first spike region 320 and the second spike region 340. For simplicity, the features of the elements having the same reference numerals are similar to those illustrated in FIG. 1, and the details are not described again herein to avoid repetition.

Referring to FIG. 2, the first spike region 320 and the second spike region 340 may extend further into the buffer layer 110. The extension of the first spike region 320 and the second spike region 340 may be controlled by adjusting the process conditions of the thermal treatment, such as the annealing temperature and/or the annealing time. The deeper extension of the first spike region 320 and the second spike region 340 allows for more contact area that may lead to an even lower contact resistance. However, the increased contact area may imply higher current leakage, which causes breakdown degradation. Therefore, the presence of the inserting structure 200 may be more critical to improve the device performance.

Figure 3:
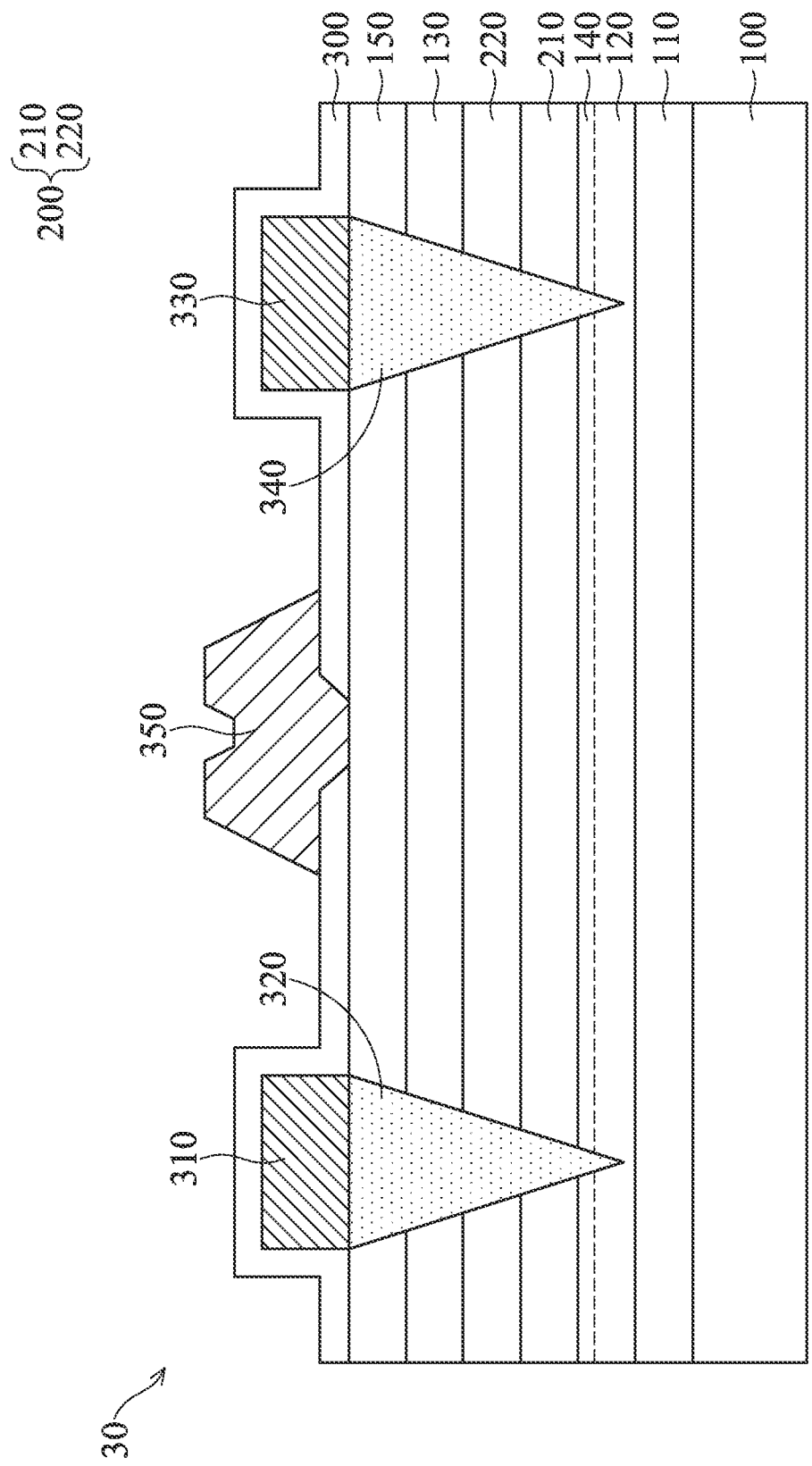
FIG. 3 is a cross-sectional view of one design of a semiconductor device, according to other embodiments of the present disclosure.

FIG. 3 is a cross-sectional view of one design of a semiconductor device 30, according to other embodiments of the present disclosure. In comparison with FIG. 1, FIG. 3 illustrates different profiles of the first spike region 320 and the second spike region 340. For simplicity, the features of the elements having the same reference numerals are similar to those illustrated in FIG. 1, and the details are not described again herein to avoid repetition.

Referring to FIG. 3, the first spike region 320 and the second spike region 340 may each include a single spike structure. It should be appreciated that, the spike structures are generated from the two-dimensional interface (the ohmic contact) between the source electrode 310/the drain electrode 330 and the cap layer 150. Due to the annealing conditions and the different material characteristics at different locations, the generated spike structures may have irregular shapes and patterns across the two-dimensional interface. While the cross-sectional view of the semiconductor device 30 may illustrate a single spike structure, the first spike region 320 and the second spike region 340 may display an entirely different profile from another cross-sectional view. In response to the impact of the spike structures of various profiles, it is imperative to include the inserting structure 200 to improve the reliability of the device.

Figure 4:
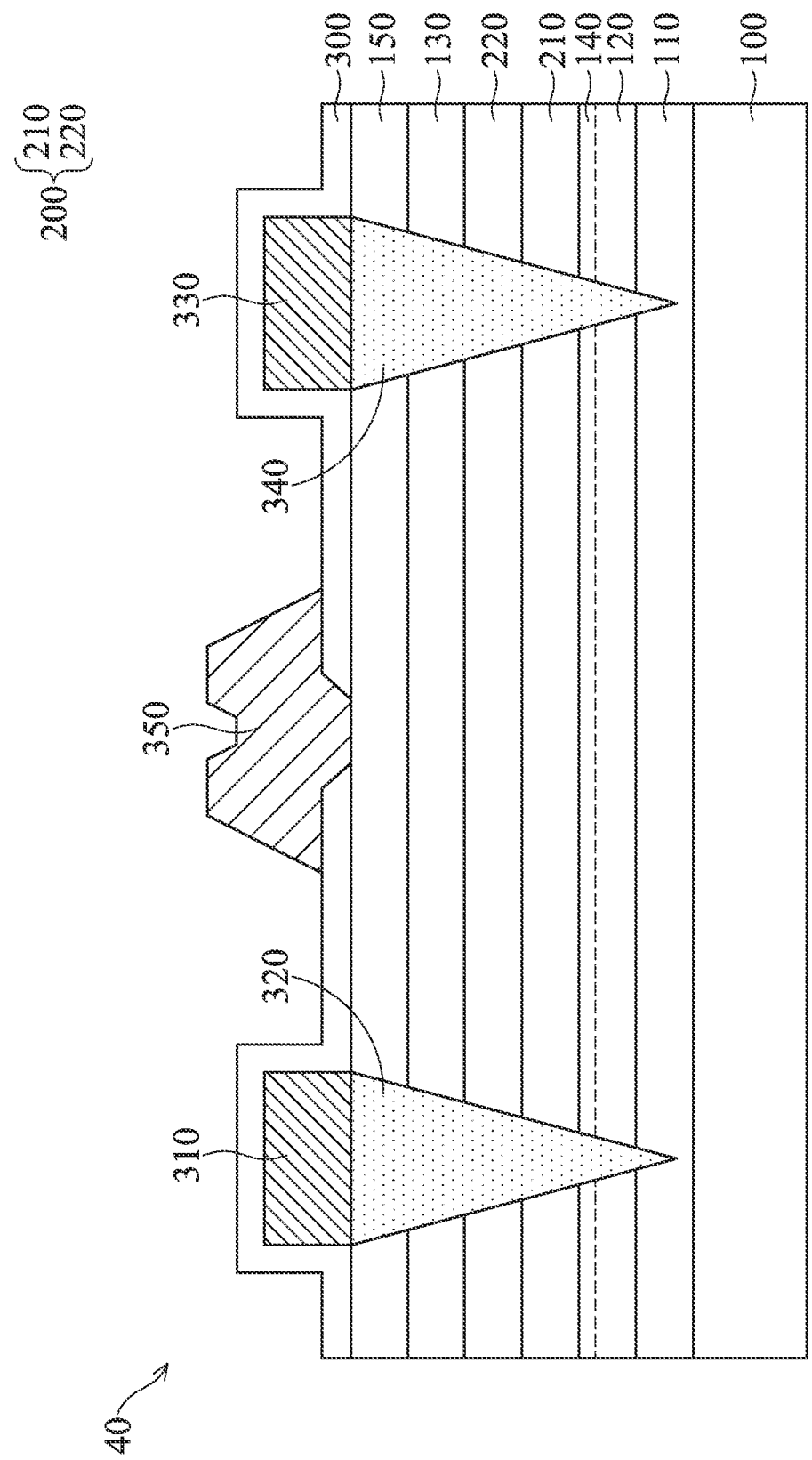
FIG. 4 is a cross-sectional view of another design of a semiconductor device, according to other embodiments of the present disclosure.

FIG. 4 is a cross-sectional view of another design of a semiconductor device 40, according to other embodiments of the present disclosure. In comparison with FIG. 3, FIG. 4 illustrates a deeper extension of the first spike region 320 and the second spike region 340. For simplicity, the features of the elements having the same reference numerals are similar to those illustrated in FIG. 1, and the details are not described again herein to avoid repetition.

Referring to FIG. 4, the first spike region 320 and the second spike region 340 may extend further into the buffer layer 110. The extension of the first spike region 320 and the second spike region 340 may be controlled by adjusting the process conditions of the thermal treatment, such as the annealing temperature and/or the annealing time. The deeper extension of the first spike region 320 and the second spike region 340 allows for more contact area that may lead to an even lower contact resistance. However, the increased contact area may imply higher current leakage, which causes breakdown degradation. Therefore, the presence of the inserting structure 200 may be more critical to improve the device performance.

Figure 5:
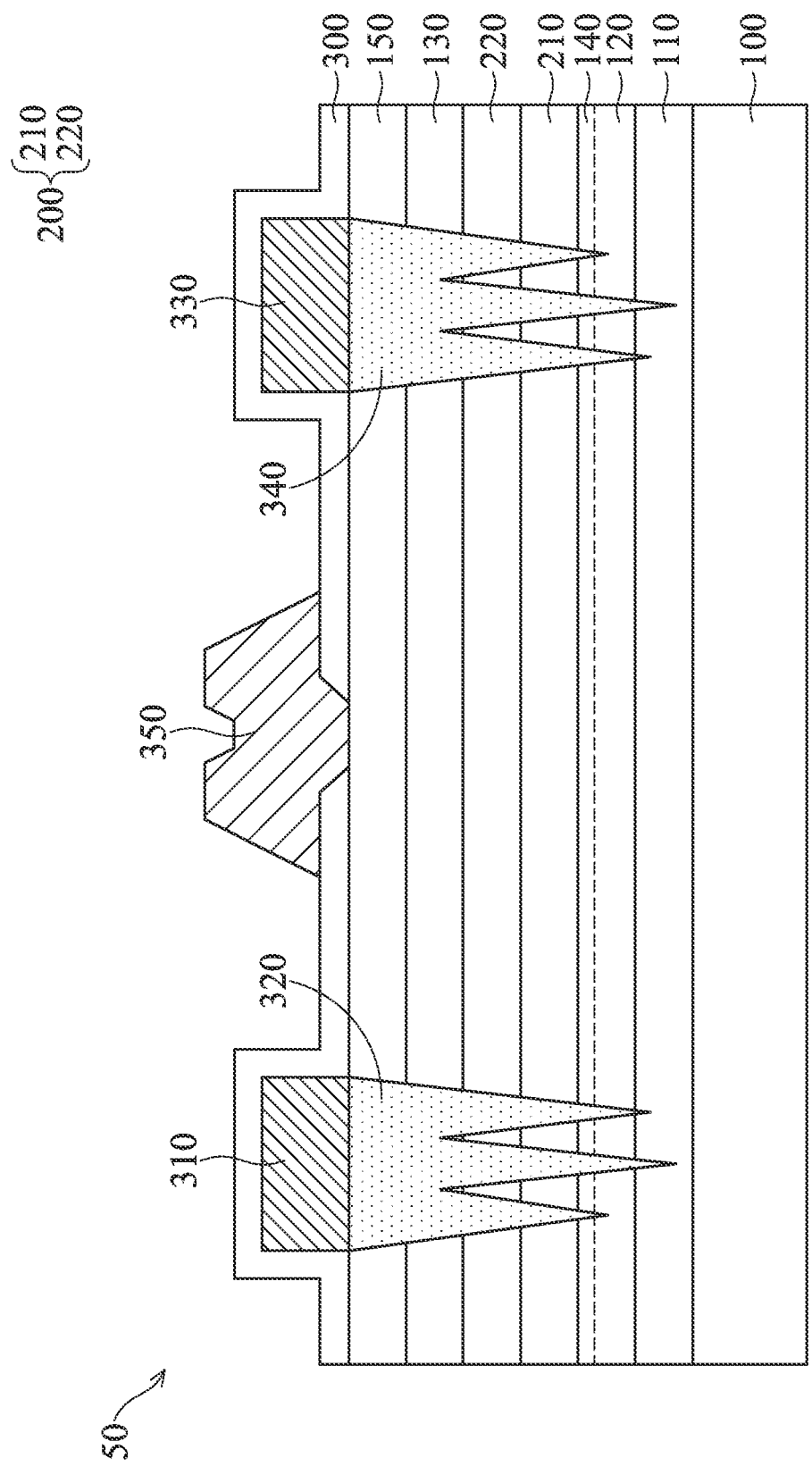
FIG. 5 is a cross-sectional view of one design of a semiconductor device, according to yet other embodiments of the present disclosure.

FIG. 5 is a cross-sectional view of one design of a semiconductor device 50, according to yet other embodiments of the present disclosure. In comparison with FIG. 1, FIG. 5 illustrates different profiles of the first spike region 320 and the second spike region 340. For simplicity, the features of the elements having the same reference numerals are similar to those illustrated in FIG. 1, and the details are not described again herein to avoid repetition.

Referring to FIG. 5, only some of the spike structures may extend further into the buffer layer 110, while other spike structures may remain in the channel layer 120. As stated earlier, due to the annealing conditions and the different material characteristics at different locations, the generated spike structures may have irregular shapes and patterns across the two-dimensional interface. Therefore, it may be understandable that the profiles of the first spike region 320 and the second spike region 340 may extend into different films of the epitaxial structure. In response to the impact of the spike structures of various profiles, it is imperative to include the inserting structure 200 to improve the reliability of the device.

The present disclosure introduces the innovative inserting structure within the epitaxial structure to compensate for the breakdown loss caused by the spike regions under the source electrode and the drain electrode. As a result, the semiconductor device of the present application is able to demonstrate a sufficiently high breakdown voltage and a relatively low contact resistance simultaneously.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:
    a substrate;
    a channel layer disposed on the substrate, wherein the channel layer is made of gallium nitride;
    a barrier layer disposed on the channel layer, wherein the barrier layer is made of $Al_zGa_{1-z}N$;
    an inserting structure inserted between the channel layer and the barrier layer, comprising:
        a first inserting layer disposed on the channel layer, wherein the first inserting layer is made of $Al_xGa_{1-x}N$; and
        a second inserting layer disposed on the first inserting layer, wherein the second inserting layer is made of $Al_yGa_{1-y}N$, and y is greater than x;
    a gate electrode disposed on the barrier layer;
    a source electrode disposed on the barrier layer at a first side of the gate electrode; and
    a drain electrode disposed on the barrier layer at a second side of the gate electrode opposite to the first side of the gate electrode, wherein a spike region is formed below at least one of the source electrode and the drain electrode.

2. The semiconductor device as claimed in claim 1, wherein x satisfies $0.15 \leq x \leq 0.50$.

3. The semiconductor device as claimed in claim 2, wherein x is between 0.15 and 0.18.

4. The semiconductor device as claimed in claim 2, wherein x is between 0.2 and 0.5.

5. The semiconductor device as claimed in claim 1, wherein y satisfies $0.5 < y \leq 1$.

6. The semiconductor device as claimed in claim 5, wherein y=1.

7. The semiconductor device as claimed in claim 1, wherein z satisfies $0.18 \leq z \leq 0.50$.

8. The semiconductor device as claimed in claim 1, wherein a ratio of x to z is between 0.5 and 1.5.

9. The semiconductor device as claimed in claim 8, wherein the ratio of x to z equals 1.

10. The semiconductor device as claimed in claim 1, wherein the first inserting layer has a first thickness, the second inserting layer has a second thickness, and a ratio of the second thickness to the first thickness is between 0.25 and 3.

11. The semiconductor device as claimed in claim 10, wherein the first thickness is between 5 Å and 20 Å.

12. The semiconductor device as claimed in claim 10, wherein the second thickness is between 5 Å and 15 Å.

13. The semiconductor device as claimed in claim 1, wherein the spike region further comprises:
    a first spike region formed below the source electrode; and
    a second spike region formed below the drain electrode.

14. The semiconductor device as claimed in claim 13, wherein the first spike region and the second spike region extend into the channel layer through the barrier layer and the inserting structure.

15. The semiconductor device as claimed in claim 13, wherein the first spike region and the second spike region comprises titanium (Ti).

16. The semiconductor device as claimed in claim 13, wherein the first spike region and the second spike region comprise titanium nitride (TiN).

17. The semiconductor device as claimed in claim 1, further comprising:
    a buffer layer disposed between the substrate and the channel layer, wherein the buffer layer is made of $Al_wGa_{1-w}N$, and w satisfies $0 \leq w \leq 0.2$.

18. The semiconductor device as claimed in claim 17, wherein the spike region further extends into the buffer layer.

19. The semiconductor device as claimed in claim 1, wherein at least one of the source electrode and the drain electrode comprises titanium (Ti), nickel (Ni), aluminum (Al), gold (Au), molybdenum (Mo), platinum (Pt), or a combination thereof.

20. A power amplifier, comprising the semiconductor device as claimed in claim 1.

* * * * *